(12) United States Patent
Javre et al.

(10) Patent No.: US 10,853,134 B2
(45) Date of Patent: Dec. 1, 2020

(54) SOFTWARE DEFINED MULTI-DOMAIN CREATION AND ISOLATION FOR A HETEROGENEOUS SYSTEM-ON-CHIP

(71) Applicant: Xilinx, Inc., San Jose, CA (US)

(72) Inventors: Somdutt Javre, Seoni (IN); Siddharth Rele, Navi Mumbai (IN); Gangadhar Budde, Renapur (IN); Appa Rao Nali, Hyderabad (IN); Chaitanya Kamarapu, Hyderabad (IN)

(73) Assignee: Xilinx, Inc., San Jose, CA (US)

( * ) Notice: Subject to any disclaimer, the term of this patent is extended or adjusted under 35 U.S.C. 154(b) by 223 days.

(21) Appl. No.: 15/956,480

(22) Filed: Apr. 18, 2018

(65) Prior Publication Data
US 2019/0324806 A1 Oct. 24, 2019

(51) Int. Cl.
| G06F 9/50 | (2006.01) |
| G06F 8/20 | (2018.01) |
| G06F 9/4401 | (2018.01) |
| G06F 8/30 | (2018.01) |

(52) U.S. Cl.
CPC .............. *G06F 9/50* (2013.01); *G06F 8/20* (2013.01); *G06F 8/30* (2013.01); *G06F 9/4405* (2013.01); *G06F 9/4406* (2013.01)

(58) Field of Classification Search
CPC ..... G06F 9/50; G06F 8/20; G06F 8/30; G06F 9/4405; G06F 9/4406
USPC ........................................................ 716/138
See application file for complete search history.

(56) References Cited

U.S. PATENT DOCUMENTS

| 10,289,785 B1 | 5/2019 | Panou | |
| 2013/0311796 A1* | 11/2013 | Brinks | ............... G06F 1/26 713/300 |

FOREIGN PATENT DOCUMENTS

WO 2016077393 A1 5/2016

OTHER PUBLICATIONS

Specification and drawings for U.S. Appl. No. 15/266,963, filed Sep. 15, 2016, Panou.
Sanders, Lester, "Isolation Methods in Zynq UltraScale+ MPSoCs," XAPP1320 (v1.0), Jul. 26, 2017, 42 pp., Xilinx, Inc., San Jose, California, USA.
WIPO Appln. PCT/US2019/021571, International Search Report and the Written Opinion, dated Jun. 4, 2019, 13 pg.

\* cited by examiner

*Primary Examiner* — Suresh Memula
(74) *Attorney, Agent, or Firm* — Kevin T. Cuenot (57) ABSTRACT

Multi-domain creation and isolation within a heterogeneous System-on-Chip (SoC) may include receiving a hardware description file specifying a plurality of processors and a plurality of hardware resources available within a heterogeneous SoC and creating, using computer hardware, a plurality of domains for the heterogeneous SoC, wherein each domain includes a processor selected from the plurality of processors and a hardware resource selected from the plurality of hardware resources. The method may include assigning, using the computer hardware, an operating system to each domain and generating, using the computer hardware, a platform that is configured to implement the plurality of domains within the heterogeneous SoC.

20 Claims, 6 Drawing Sheets

SOFTWARE DEFINED MULTI-DOMAIN CREATION AND ISOLATION FOR A HETEROGENEOUS SYSTEM-ON-CHIP

TECHNICAL FIELD

This disclosure relates to integrated circuits (ICs) and, more particularly, to creating and isolating multiple domains within a heterogeneous System-on-Chip (SoC) type of IC.

BACKGROUND

An SoC refers to a type of integrated circuit (IC) that includes a processor capable of executing program code and one or more other subsystems. The processor is capable of operating in coordination with the other subsystem(s). A heterogeneous SoC refers to an IC that includes two or more processors. The processors may have different architectures, e.g., utilize different instruction sets. The processors may also operate independently of one another. For example, a first processor of such a heterogeneous SoC may execute a first operating system and application, while a second processor of the heterogeneous SoC may execute a second and different operating system and/or application.

SUMMARY

In one or more embodiments, a method may include receiving a hardware description file specifying a plurality of processors and a plurality of hardware resources available within a heterogeneous SoC and creating, using computer hardware, a plurality of domains for the heterogeneous SoC, wherein each domain includes a processor selected from the plurality of processors and a hardware resource selected from the plurality of hardware resources. The method may include assigning, using the computer hardware, an operating system to each domain and generating, using the computer hardware, a platform that is configured to implement the plurality of domains within the heterogeneous SoC.

In one or more embodiments, a system includes a memory configured to store program code and a processor coupled to the memory. The processor, in response to executing the program code, is configured to initiate operations. The executable operations may include receiving a hardware description file specifying a plurality of processors and a plurality of hardware resources available within a heterogeneous SoC and creating a plurality of domains for the heterogeneous SoC, wherein each domain includes a processor selected from the plurality of processors and a hardware resource selected from the plurality of hardware resources. The operations may include assigning an operating system to each domain and generating a platform that is configured to implement the plurality of domains within the heterogeneous SoC.

In one or more embodiments, a computer program product includes a computer readable storage medium having program code stored thereon. The program code is executable by computer hardware to initiate operations. The operations may include receiving a hardware description file specifying a plurality of processors and a plurality of hardware resources available within a heterogeneous SoC and creating a plurality of domains for the heterogeneous SoC, wherein each domain includes a processor selected from the plurality of processors and a hardware resource selected from the plurality of hardware resources. The operations may include assigning an operating system to each domain and generating a platform that is configured to implement the plurality of domains within the heterogeneous SoC.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description and upon reference to the drawings.

DETAILED DESCRIPTION

While the disclosure concludes with claims defining novel features, it is believed that the various features described within this disclosure will be better understood from a consideration of the description in conjunction with the drawings. The process(es), machine(s), manufacture(s) and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

This disclosure relates to ICs and, more particularly, creating and isolating multiple domains within a heterogeneous SoC. In accordance with the inventive arrangements disclosed herein, different domains, e.g., software domains, may be created for implementation within a heterogeneous SoC. Each domain, in effect, implements a subsystem of the heterogeneous SoC. The domains may be created using an application-level tool as opposed to a hardware design tool. Each domain for the heterogeneous SoC may be created to include various resources, whether hardware and/or software. Each domain, when implemented in the heterogeneous SoC, may be used to implement and/or execute one or more embedded applications by leveraging hardware isolation features available in the heterogeneous SoC. For purposes of description, the term "SoC" or "System-on-Chip" refers to a heterogeneous SoC within this disclosure.

In one or more embodiments, a hardware design tool (e.g., Electronic Design Automation (EDA) tool) may be used to generate a hardware description file for a design. The hardware description file, as generated by the hardware design tool, specifies the particular hardware resources of an SoC that are instantiated and, as such, are available for use by a given design to be implemented within the SoC. For example, the hardware description file may specify which processors of the SoC are available for use and which peripheral devices of the SoC are available for use by the design. The hardware description file specifies the hardware resources of the SoC that may be used by embedded applications, e.g., the program code that is created to run or execute on the SoC. In this regard, an SoC may include more hardware resources than are defined within the hardware description file generated by the hardware design tool.

In one or more embodiments, the hardware description file may be exported from the hardware design tool and imported by a computer-based domain creation tool. The domain creation tool is capable of generating multiple domains based upon the hardware description file. The domain creation tool, for example, is capable of defining a plurality of domains where each domain includes a processor from the hardware description file. The domain creation tool is capable of assigning different hardware resources specified within the hardware description file to the different domains that are created.

The domain creation tool is capable of generating a platform that specifies the domains that have been created. The platform may include a variety of different software artifacts for the different domains. As an example, the domain creation tool is capable of generating configuration data that may be loaded into the SoC to implement the various domains. The configuration data, when loaded into the SoC, is capable of creating the domains and isolating the domains from one another. In another example, the domain creation tool is capable of generating one or more software artifacts tailored to the different domains. The software artifacts may be used to generate executable program code (e.g., embedded applications) intended for execution in particular ones of the domains.

In one or more embodiments, the domain creation tool is also capable of modifying the domains that are created from the hardware design system. For example, a software developer may utilize the domain creation tool to modify one or more of the different domains based upon the original hardware description file that was initially used to create the original domains. Thus, a new and/or different hardware description file need not be generated by the hardware design application to change and/or modify the domains of the SoC.

Further aspects of the inventive arrangements are described below in greater detail with reference to the figures. For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

Figure 1:
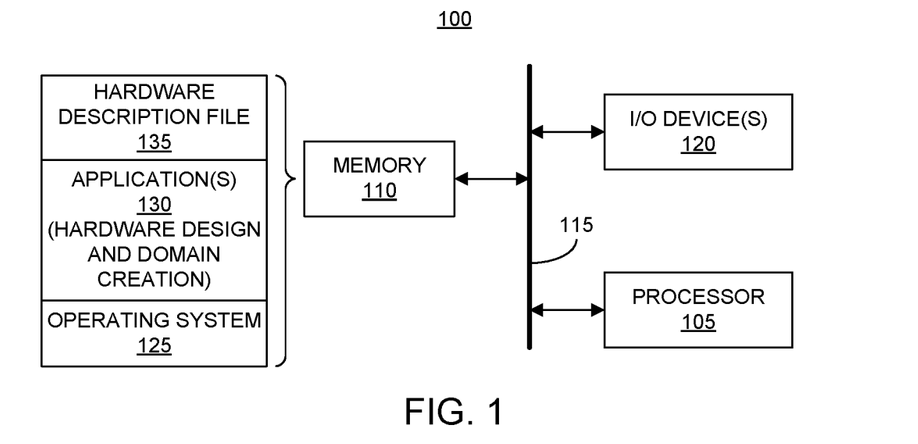
FIG. 1 illustrates an example system for use with one or more embodiments described within this disclosure.

FIG. 1 illustrates an example system 100 for use with one or more embodiments described herein. System 100 is an example of computer hardware that may be used to implement a computer, a server, a portable computer such as a laptop or a tablet computer, or other data processing system. A system or a device implemented using computer hardware is capable of performing the various operations described herein relating to creating and isolating multiple domains within an SoC and/or processing a circuit design for implementation within an SoC.

In the example of FIG. 1, system 100 includes at least one processor 105. Processor 105 is coupled to memory 110 through interface circuitry 115. System 100 is capable of storing computer readable instructions (also referred to as "program code") within memory 110. Memory 110 is an example of computer readable storage media. Processor 105 is capable of executing the program code accessed from memory 110 via interface circuitry 115.

Memory 110 may include one or more physical memory devices such as, for example, a local memory and a bulk storage device. Local memory refers to non-persistent memory device(s) generally used during actual execution of program code. Examples of local memory include random-access memory (RAM) and/or any of the various types of RAM that are suitable for use by a processor during execution of program code (e.g., dynamic RAM or "DRAM" or static RAM or "SRAM"). A bulk storage device refers to a persistent data storage device. Examples of bulk storage devices include, but are not limited to, a hard disk drive (HDD), a solid-state drive (SSD), flash memory, a read-only memory (ROM), an erasable programmable read-only memory (EPROM), electrically erasable programmable read-only memory (EEPROM), or other suitable memory. System 100 may also include one or more cache memories (not shown) that provide temporary storage of at least some program code in order to reduce the number of times program code must be retrieved from a bulk storage device during execution.

Memory 110 is capable of storing program code and/or data. For example, memory 110 is capable of storing various routines, programs, objects, components, logic, other suitable instructions, and/or other data structures. For purposes of illustration, memory 110 stores an operating system 125, one or more application(s) 130, and a hardware description file 135. Memory 110 may also store a circuit design. In one or more embodiments, application(s) 130 may include a hardware design application (e.g., an electronic design automation or EDA application) and/or a domain creation application. The hardware design application is capable of generating a hardware system and storing the hardware system as hardware description file 135. Hardware description file 135 may specify different hardware resources of the target SoC that have been instantiated and, as such, are available for use by a design to be implemented in the target SoC. Examples of hardware resources include, but are not limited to, processors (and/or processor cores), memories, peripherals, storage devices, and/or other hardware components of an SoC that have been instantiated and are available for use.

The domain creation application is capable of performing operations described herein relating to the creation and isolation of domains within an SoC. The hardware design application may also perform one or more operations of a design flow (e.g., synthesis, placement, routing, and/or bitstream generation) to implement a circuit design within the SoC.

System 100, e.g., processor 105, is capable of executing operating system 125 and application(s) 130 to perform the operations described within this disclosure. As such, operating system 125 and application(s) 130 may be considered an integrated part of system 100. Further, it should be appreciated that any data used, generated, and/or operated upon by system 100 (e.g., processor 105) are functional data structures that impart functionality when employed as part of the system.

Examples of interface circuitry 115 include, but are not limited to, a system bus and an input/output (I/O) bus. Interface circuitry 115 may be implemented using any of a variety of bus architectures. Examples of bus architectures may include, but are not limited to, Enhanced Industry Standard Architecture (EISA) bus, Accelerated Graphics Port (AGP), Video Electronics Standards Association (VESA) local bus, Universal Serial Bus (USB), and Peripheral Component Interconnect Express (PCIe) bus.

System 100 further may include one or more I/O devices 120 coupled to interface circuitry 115. I/O devices 120 may be coupled to system 100, e.g., interface circuitry 115, either directly or through intervening I/O controllers. Examples of I/O devices 120 include, but are not limited to, a keyboard, a display device, a pointing device, one or more communication ports, and a network adapter. A network adapter refers to circuitry that enables system 100 to become coupled to other systems, computer systems, remote printers, and/or remote storage devices through intervening private or public networks. Modems, cable modems, Ethernet cards, and wireless transceivers are examples of different types of network adapters that may be used with system 100.

System 100 may include fewer components than shown or additional components not illustrated in FIG. 1 depending upon the particular type of device and/or system that is implemented. In addition, the particular operating system, application(s), and/or I/O devices included may vary based upon system type. Further, one or more of the illustrative components may be incorporated into, or otherwise form a portion of, another component. For example, a processor may include at least some memory. System 100 may be used to implement a single computer or a plurality of networked or interconnected computers each implemented using the architecture of FIG. 1 or an architecture similar thereto.

The inventive arrangements described within this disclosure are capable of creating a plurality of different domains within an SoC. System 100, e.g., executing the domain creation application, is capable of receiving hardware description file 135, which defines the hardware environment available for use by embedded software. Embedded software refers to program code that is intended to run or execute in a particular domain of the SoC.

System 100, in executing the domain creation application, is capable of defining each of a plurality of different domains that may be implemented within the SoC. Each domain is assigned one of the available processors of the SoC from hardware description file 135. In addition, system 100 is capable of specifying the particular operating system to be executed by the processor in each of the domains.

System 100, in executing the domain creation application, is also capable of assigning different ones of the hardware resources from hardware description file 135 to different ones of the domains. In particular embodiments, system 100 is capable of generating software artifacts such as configuration data that, when loaded into the SoC, creates the domains and enforces isolation among the domains during operation of the SoC. For example, once a design to be implemented within the SoC is complete and is loaded into the SoC, circuitry within the SoC prevents one domain from accessing elements of the SoC assigned to other domains thereby ensuring independence and secure operation by the respective domains.

In conventional systems, a hardware design is created using design tools. The hardware design is unaware of the operating system assignments and the related settings for the processors of the design. The hardware design is output as a hardware description file to software developers. The hardware description file, however, was provided as a rigid block of hardware that the user (e.g., the software developer) is unable to alter. The software developers were unable to modify the resources available to any given processor.

In accordance with the inventive arrangements described herein, system 100 allows the user (e.g., the software developer) to specify and create different domains based upon the hardware description file. System 100, for example, is capable of using the existing hardware description file and allocate boundaries that include the assigned hardware resources and operating system to run the processor that is also allocated to the various domains that are created. The domains may be modified using the original (and unchanged) hardware description file.

Figure 2:
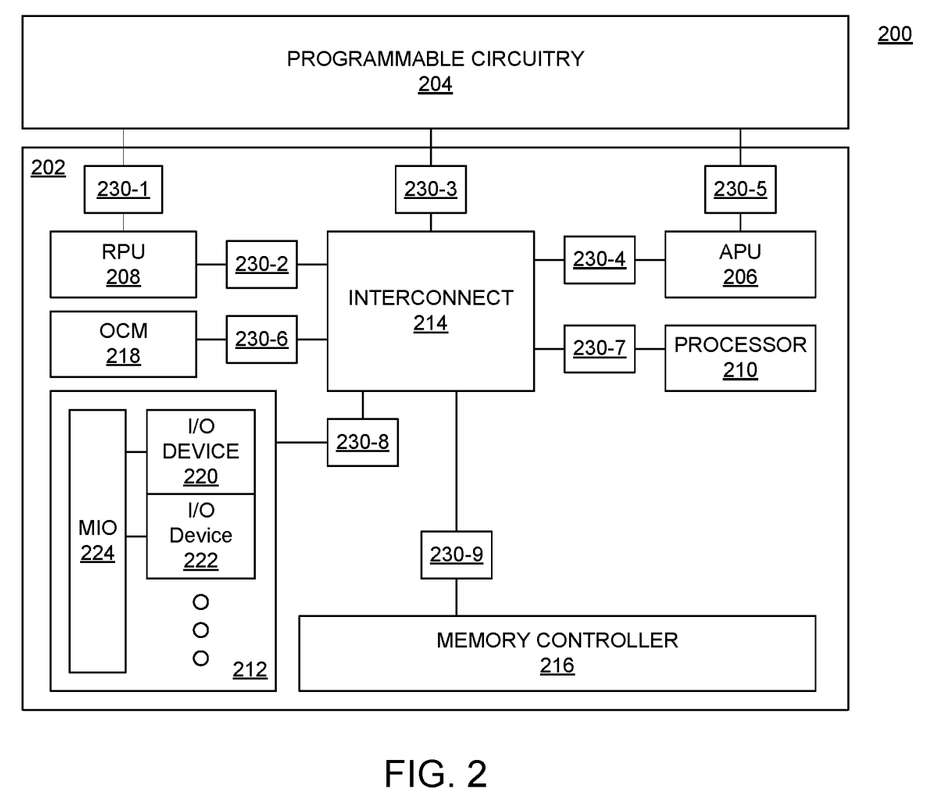
FIG. 2 illustrates an example of a heterogeneous SoC.

FIG. 2 illustrates an example of a heterogeneous SoC 200. In the example of FIG. 2, SoC 200 includes a processor system 202 and programmable circuitry 204. Processor system 202 is a hardwired region of SoC 200 that includes two or more processors that are configured to execute program code. In one or more embodiments, programmable circuitry 204 may be implemented as field programmable gate array (FGPA) circuitry and/or programmable logic. Due to the inclusion of programmable circuitry 204, SoC 200 may also be referred to as a programmable SoC.

In general, the functionality of programmable circuitry 204 is not established until configuration data is loaded into configuration memory cells (not shown) of SoC 200. A set of configuration bits may be used to program programmable circuitry 204. The configuration bit(s) typically are referred to as a "configuration bitstream" or "bitstream." In general, programmable circuitry is not operational or functional without first loading a configuration bitstream into SoC 200. The configuration bitstream effectively implements a particular circuit design or circuit structures and connections within programmable circuitry 204. The circuit design specifies, for example, functional aspects of the programmable circuit blocks and physical connectivity among the various programmable circuit blocks of programmable circuitry 204.

Circuitry that is "hardwired" or "hardened," i.e., not programmable, is manufactured as part of SoC 200. Unlike programmable circuitry 204, hardened circuitry or hardened circuit blocks are not implemented after the manufacture of SoC 200 through the loading of a configuration bitstream. Hardened circuitry is generally considered to have dedicated circuit blocks and interconnects, for example, that are functional without first loading a configuration bitstream into SoC 200.

Processor system 202 includes a variety of different processors. In one aspect, the different processors of processor system 202 are physically distinct instances, but have same architectures (use same instruction sets). In another aspect, the different processors of processor system 202 are physically distinct instances and utilize two or more different architectures (e.g., utilize different instruction sets). In the example of FIG. 2, processor system 202 includes an application processing unit (APU) 206, a real-time processing unit (RPU) 208, and/or processor 210.

APU 206 may include one or more cores. For purposes of discussion within this disclosure, a core is considered a "processor" that is configured to execute program code. RPU 208 may include one or more cores. In one or more embodiments, RPU 208 is capable of executing real-time applications. Examples of real-time applications include, but are not limited to, automotive, mass storage, mobile baseband, medical, and/or industrial applications. Both APU 206 and RPU 208 may be directly connected to programmable circuitry 204 through isolation circuits 230-1 and 230-5, respectively.

As noted, in one aspect, the different processors (e.g., including cores) may have different architectures. In one example, processor 210 is implemented as a hardened version of the MicroBlaze™ processor from Xilinx, Inc. of San Jose, Calif. APU 206 may be implemented as a multicore processor from Arm Ltd. of Cambridge, UK such as the ARM CORTEX-A9. RPU 208 may be implemented as an ARM CORTEX-R5 processor also available from Arm Ltd. The example processor architectures described herein are provided for purposes of illustration. One skilled in the art will appreciate that other architectures may be used for implementing processors in SoC 200 such as an x86 processor architecture and so forth.

Processor system 202 further may include an input/output (I/O) subsystem 212, interconnect 214, a memory controller 216, and on-chip memory (OCM) 218. In the example of FIG. 2, interconnect 214 is coupled to RPU 208, OCM 218, APU 206, processor 210, I/O subsystem 212, and memory controller 216. As pictured, interconnect 214 may be connected to such elements through intervening isolation circuits 230-2, 230-6, 230-4, and 230-7, respectively.

In one or more embodiments, interconnect 214 is implemented as an on-chip interconnect. An example of an on-chip interconnect is an AMBA eXtensible Interface (AXI) bus. An AMBA AXI bus is an embedded microcontroller bus interface for use in establishing on-chip connections between circuit blocks and/or systems. Other example implementations of an interconnect may include, but are not limited to, buses, cross-bars, network on chips (NoCs), switches, and so forth.

I/O subsystem 212 includes a plurality of I/O devices such as I/O devices 220 and 222. I/O subsystem 212 may include more than two I/O devices. Each of I/O devices 220 and 222 is coupled to a multiplexer I/O (MIO) 224. MIO 224 is configurable to provide processor system 202 and/or programmable circuitry 204 with access to nodes external to SoC 200 and to the various I/O devices of SoC 200. MIO 224 may be configured on a per pin basis and may facilitate concurrent access to I/O devices 220 and/or 222 by processor system 202 and/or programmable circuitry 204.

In the example of FIG. 2, instances of isolation circuit 230 are included within SoC 200. In one or more embodiments, each of isolation circuits 230 is configurable to regulate or control access to hardware resources in SoC 200. Each isolation circuit 230, for example, may be configured, through the loading of configuration data, to allow only selected hardware resources to access other hardware resources. The configuration data may also specify implementation options for elements within processor system 202. As such, the configuration data may specify and/or implement the different domains within SoC 200.

For example, isolation circuit 230-2 is in the signal path between RPU 208 and interconnect 214 and is capable of regulating which hardware resources of SoC 200 is/are permitted to interact with RPU 208. Isolation circuit 230-6 is in the signal path between OCM 218 and interconnect 214 and is capable of regulating which hardware resources of SoC 200 is/are permitted to interact with OCM 218. Isolation circuit 230-4 is in the signal path between APU 206 and interconnect 214 and is capable of regulating which hardware resources of SoC 200 is/are permitted to interact with APU 206. Isolation circuit 230-7 is in the signal path between processor 210 and interconnect 214 and is capable of regulating which hardware resources of SoC 200 is/are permitted to interact with processor 210.

Further, isolation circuit 230-8 is in the signal path between interconnect 214 and I/O subsystem 212 (e.g., in the signal path to each of the I/O devices). Isolation circuit 230-8 is capable of regulating which hardware resources of SoC 200 is/are permitted to interact with I/O subsystem 212, e.g., on a per I/O device basis. Isolation circuit 230-9 is in the signal path between interconnect 214 and memory controller 216 and is capable of regulating which hardware resources of SoC 200 is/are permitted to interact with memory controller 216 and/or access (e.g., read and/or write) particular regions of memory (not shown) coupled to memory controller 216. Further, isolation circuits 230-1, 230-3, and 230-5 are in the signal path between programmable circuitry 204 and RPU 208, interconnect 214, and APU 206, respectively. Isolation circuit 230-1 is capable of regulating access of circuits in programmable circuitry 204 to RPU 208 and/or access of RPU 208 to circuits in programmable circuitry 204. Isolation circuit 230-3 is capable of regulating access of circuits in programmable circuitry 204 to interconnect 214 and/or interconnect 214 to circuits in programmable circuitry 204. Isolation circuit 230-5 is capable of regulating access of circuits in programmable circuitry 204 to APU 206 and/or APU 206 to circuits in programmable circuitry 204.

In general, isolation circuits 230 may be programmed to implement different domains within SoC 200. Isolation circuits 230 may be programmed to permit only those hardware resources belonging to the same domain to communicate with one another. In particular embodiments, isolation circuits 230 implement a logical separation of hardware resources of SoC 200 into different domains. For example, isolation circuits 230 may permit access or deny access based upon the address being accessed and/or the identifier of the circuit attempting to access another hardware resource.

As an illustrative and non-limiting example, different ones of the I/O devices 220 and/or 222 may be assigned to a particular one of the processors. For instance, a first domain may be created that includes APU 206, memory controller 216 (e.g., a particular region of RAM), and I/O device 220. A second domain may be created that includes RPU 208, I/O device 222, memory controller 216 (e.g., a second and different region of RAM) and OCM 218. In this example, isolation circuits 230 enforce domain isolation and, for example, prevent RPU 208 from accessing I/O device 220 and prevent APU 206 from accessing I/O device 222. Isolation circuits 230 further prevent APU 206 from accessing the second region of RAM and prevent RPU 208 from accessing the first region of RAM.

In one or more embodiments, particular ones of isolation circuits 230 may be implemented as a memory protection unit. For example, isolation circuits 230-6 and 230-9 may be implemented as memory protection units. In one or more other embodiments, particular ones of isolation circuits 230 may be implemented as processor protection units. For example, isolation circuits 230-1, 230-2, 230-4, 230-5, and 230-7 may be implemented as processor protection units.

Figure 3:
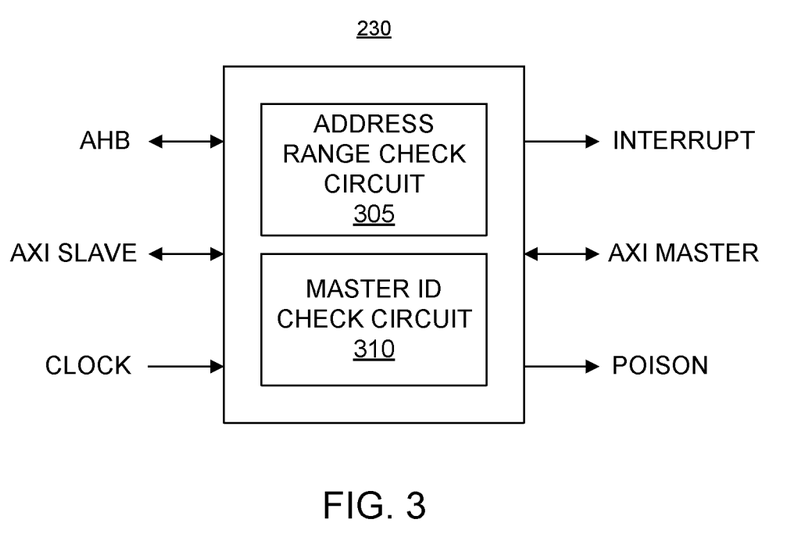
FIG. 3 illustrates an example of an isolation circuit.

FIG. 3 is an example of isolation circuit 230. The example of FIG. 3 may be a memory protection unit. For purposes of illustration, FIG. 3 utilizes AXI interface terminology. It should be appreciated that isolation circuit 230 of FIG. 3 may be implemented to work with any of a variety of different bus and/or interconnect protocols.

In the example of FIG. 3, address range check circuit 305 checks whether the address of a received transaction is within the region defined by a start address and an end address, which may be stored in configuration registers of isolation circuit 230 (e.g., by virtue of writing configuration data to the configuration registers). Further, master ID (identifier) circuit 310 is capable of checking whether the master ID of the incoming transaction is allowed based upon configuration data stored in the configuration registers of isolation circuit 230.

Isolation circuit 230 may disallow any transaction that does not meet the check performed by address range check circuit 305 and master ID circuit 310. Isolation circuit 230 may also poison the transaction (e.g., exert the "poison" signal). Depending upon the configuration of isolation circuit 230, an interrupt may be generated in the case where a transaction does not meet the checks performed and/or the poison signal is asserted.

Figure 4:
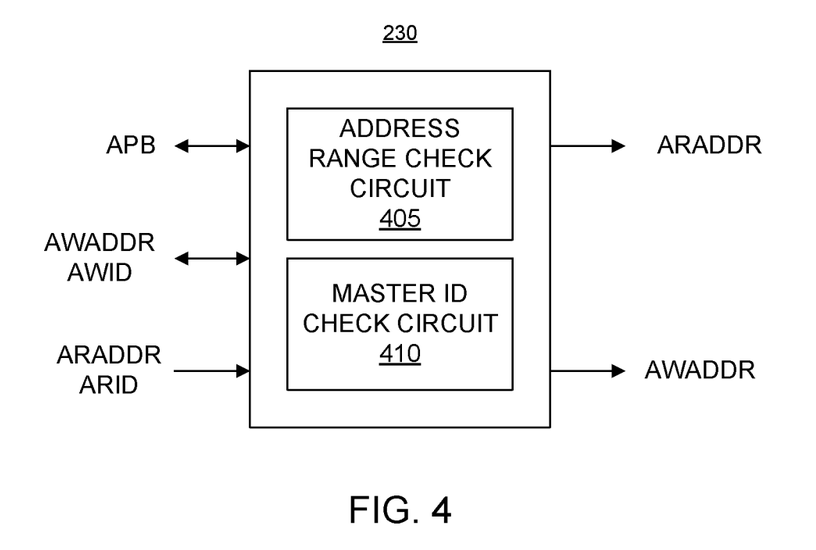
FIG. 4 illustrates another example of an isolation circuit.

FIG. 4 is another example of isolation circuit 230. The example of FIG. 4 may be a processor protection unit. For purposes of illustration, FIG. 4 utilizes AXI interface terminology. It should be appreciated that isolation circuit 230 of FIG. 4 may be implemented to work with any of a variety of different bus and/or interconnect protocols.

In the example of FIG. 4, a master ID list, stored within isolation circuit 230, is used to define the masters that are allowed to access peripherals. An aperture permission list, stored within isolation circuit 230, specifies permissions on peripheral addresses that masters can access. Master ID check circuit 410 checks that the AXI master ID of a received transaction is in the aperture permission list. Permissions are based on master ID. The AXI slave entry comes from a corresponding bit in the permission field. Address range circuit 405 is capable of checking that the address range accessed by the master, per the configuration data, is allowed. If the requirements are not met, the transaction is poisoned, and an interrupt is optionally generated.

Referring to both FIG. 3 and FIG. 4, an error response signal, e.g., the poison signal, may be generated in response to determining that a transaction is illegal (e.g., the transaction fails one or both checks performed by isolation circuit 230). The error signal causes a data abort or an interrupt signal to be generated.

Figure 5:
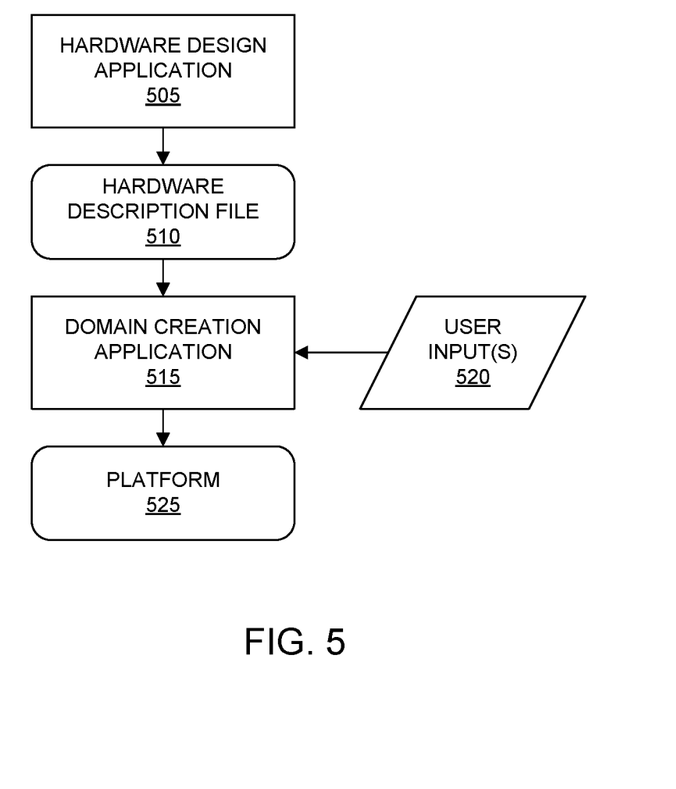
FIG. 5 illustrates an example of creating and isolating multiple domains within a heterogeneous SoC.

FIG. 5 illustrates an example of creating and isolating multiple domains within a heterogeneous SoC. In the example of FIG. 5, hardware design application 505 generates a hardware description file 510. Hardware description file 510 specifies the different hardware resources of the SoC that are available for use. Domain creation application 515 receives hardware description file 510. Based upon user inputs 520 specifying domains, e.g., which processors are included in each respective domains, the operating system to be executed by each processor, peripherals and/or memory to be available to each processor in each domain, domain creation application 515 outputs a platform 525 that specifies the domains.

In one or more embodiments, platform 525 includes one or more software artifacts. The software artifacts may include configuration data, a first stage boot loader, and/or other software artifacts that may be used in building embedded applications for the different domains of the SoC. For example, the software artifacts may include drivers for the peripherals included in each of the different domains.

Figure 6:
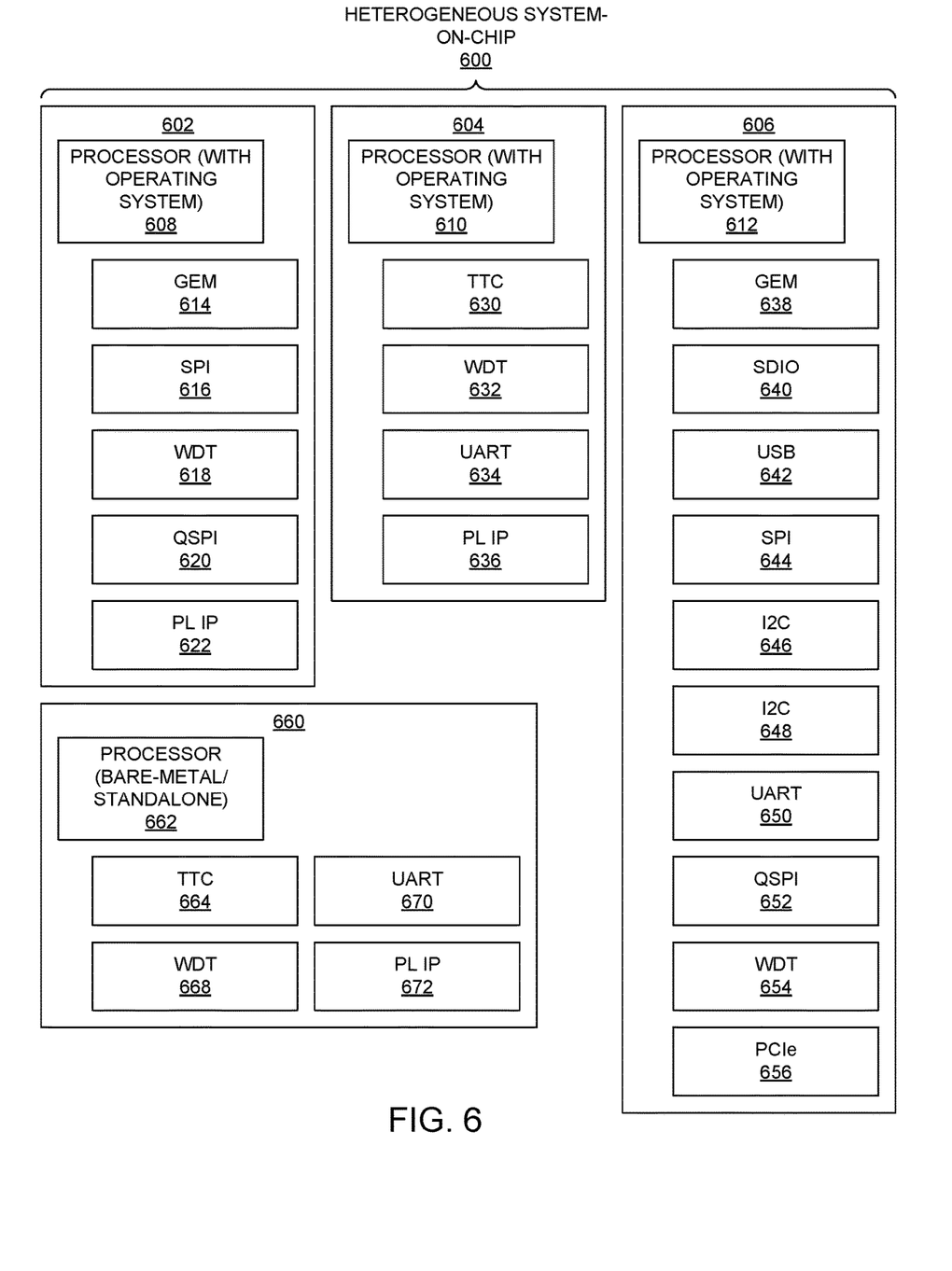
FIG. 6 illustrates an example of multiple domains for a heterogeneous SoC.

FIG. 6 illustrates an example of multiple domains for a heterogeneous SoC 600. In the example of FIG. 6, domains 602, 604, 606, and 660 are shown. In an aspect, each of the resources shown within domains 602, 604, 606, and 660 (with the exception of the operating systems) is specified as being available within the hardware description file. For purposes of illustration, each of domains 602, 604, and 606 utilizes an operating system. Domain 660 may not use an operating system and support one or more bare-metal and/or standalone application(s).

As illustrated, domain 602 includes processor 608, General Equipment Model (GEM) interface 614, Serial Peripheral Interface (SPI) 616, watchdog timer (WDT) 618, Quad Serial Peripheral Interface (QSPI) 620, and programmable logic Intellectual Property (PL IP) 622. Programmable logic IP refer to an IP or a core that is implemented in programmable circuitry. Domain 604 includes processor 610, a timing trigger and control (TTC) interface 630, WDT 632, Universal Asynchronous Receiver-Transmitter (UART) 634, and PL IP 636. Domain 606 includes processor 612, GEM interface 638, Secure Digital Input Output (SDIO) 640, Universal Serial Bus (USB) 642, SPI 644, Inter-Integrated circuit (I2C) interface 646, I2C interface 648, UART 650, QSPI 652, WDT 654, and Peripheral Component Interconnect Express (PCIe) 656. Domain 660 includes a processor 662 (e.g., without an operating system), TTC interface 664, WDT 668, UART 670, and PLIP 672.

Figure 7:
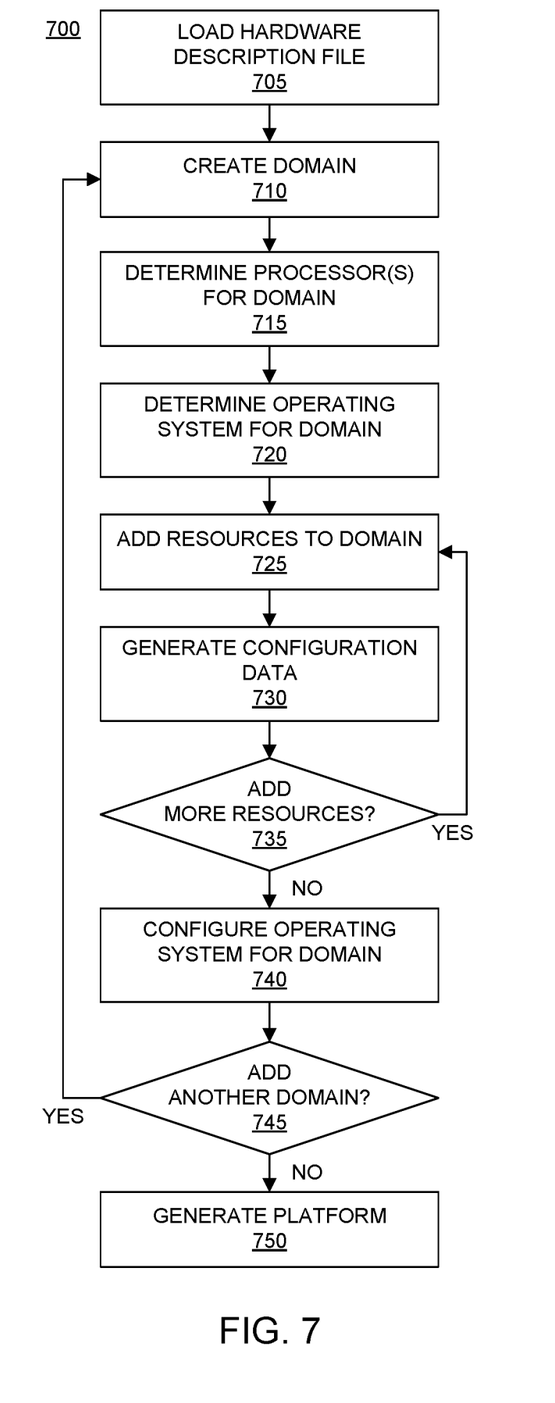
FIG. 7 illustrates an example method of creating and isolating multiple domains within a heterogeneous SoC.

FIG. 7 illustrates an example method 700 of creating and isolating multiple domains within an SoC. Method 700 may be performed by a computing system as described herein in reference to FIG. 1 executing a domain creation application.

In block 705, the system loads, or receives, a hardware description file. The hardware description file may be obtained from a hardware design application in which a hardware designer instantiates hardware resources that will be available in the SoC. The hardware description file specifies the hardware resources that have been instantiated and that are available for a design. The hardware description file further may include additional details relating to the listed hardware resources.

In block 710, the system creates a domain. For example, a user may provide a user input requesting the creation of a domain. In one or more embodiments, the system provides a graphical user interface (GUI) through which the user may request creation of a domain. In one or more other embodiments, the system provides a command line interface through which a user may provide a command to create a domain. In response to a request to do so, the system creates a domain for the SoC.

In block 715, the system determines a processor for the domain. For example, subsequent to the command to create a domain, the system may receive a further user input specifying a processor listed in the hardware description file to assign to the domain. In particular embodiments, the processor may be specified as part of the command, e.g., as a parameter or argument of the command, to create the domain. In response to receiving a user input specifying a processor, the system creates a domain and assigns the processor to the domain. For example, the system creates a data structure in memory that associates the processor with the domain.

In block 720, the system determines the operating system for the domain. For example, the system may receive a further user input specifying a particular operating system to be used for the domain. In one or more embodiments, the command to create the domain may include or specify the operating system as a further parameter or argument of the command. Examples of different types of operating systems that may be selected for use in the domain include, but are not limited to, Linux, a Real-time Operating System (RTOS) such as Free RTOS, or any other operating system that is suitable for execution by a processor or an embedded processor. In other embodiments, a domain may not include an operating system and support one or more bare-metal and/or standalone applications.

In conventional embedded system development techniques, software developers were restricted to utilizing the particular operating system associated with a processor based upon the hardware design. In accordance with the inventive arrangements described within this disclosure, the software developer is free to choose different operating systems. The software developer may experiment with different operating system/processor pairings and/or different operating system configurations (e.g., different address space mappings, different drivers, etc. per block 725 below).

In block 725, the system is capable of adding one or more resources to the domain created in blocks 710 and 715. In one or more embodiments, the system adds resource(s) to the domain by assigning the resource(s) to the domain. The resources may be hardware resources selected from the hardware description file. Examples of hardware resources can include, but are not limited to, memories and devices (e.g., memory controllers, I/O devices, and/or other peripherals). The resources may also include software resources for the selected operating system. Examples of software resources can include, but are not limited to, drivers, physical address space mappings, and/or firmware.

In one or more embodiments, the system is capable of pruning properties of hardware resources added to the domain. For example, the system is capable of modifying properties of hardware resources by altering the configurable registers of such hardware resources, e.g., altering the configuration data written to the registers. As an illustrative and nonlimiting example, the system is capable of changing the clock frequency of a UART.

Within block 725, additional properties may also be added to the domain and/or attached to resources added to the domain. For example, Quality of Service (QoS) settings may be specified for particular hardware resources added to the domain. Isolation settings may also be specified for the domain and/or for particular hardware resources added to the domain. Clock frequencies may be specified for the hardware resources of the domain. The system, in response to receiving such properties, assigns the properties to the domain and/or to the relevant hardware resources of the domain.

In block 730, the system is capable of generating configuration data that implements the domain. The configuration data is capable of isolating the domain within the SoC. The configuration data, for example, may be data that is loaded into configuration registers for the particular isolation circuits used to regulate access to the particular hardware resources assigned to the domain. If, for example, the domain includes APU 206, the configuration data generated in block 730 may be for isolation circuits 230-5 and/or 230-4. As noted, the isolation circuits of the SoC to create the domains and enforce isolation between the domains once configured.

In block 735, the system determines whether there are more resources to be added to the domain. For example, the user may provide an input indicating that the domain is complete. In another example, the user may provide an input indicating that additional resources are to be added to the domain. In response to determining that more resources are to be added to the domain, method 700 loops back to block 725 to add more resources to the domain. In response to determining that no further resources are to be added to the domain, method 700 continues to block 740.

In block 740, the system configures the operating system of the domain. For example, the system is capable of partitioning RAM (e.g., off-chip RAM accessible via the memory controller) for the domain. As an example, for the current domain being configured, the operating system may be Linux. The version of Linux used for the current domain may be able to access up to 4 GB of RAM. The user may provide an input specifying that of the available RAM specified in the hardware description file, the domain created in blocks 710 and 715 is to be allocated 1 GB of RAM. During further iterations of method 700 when configuring a different domain, further portions of RAM may be allocated to such other domains having different processors and/or operating systems.

As part of block 740, the system is further capable of determining the devices that have been added to the domain and including a driver for each particular device. For example, if the domain includes a UART (e.g., UART0), another UART (e.g., UART1), and a USB interface, the system is capable of selecting drivers for each particular type (and instance) of device selected for inclusion in the domain and for the particular operating system that has been selected for the domain. Referring to the prior example where Linux is the operating system for the domain, the system chooses the Linux version of the driver for each device added to the domain.

As part of block 740, the system further may generate an image file for the operating system of the domain. Continuing with the prior example, the system generates a Linux image file that is configured to access only 1 GB of RAM and which includes Linux drivers for each of the devices included in the domain.

In block 745, the system determines whether to add another domain for the SoC. For example, the user may provide a user input requesting the creation of another domain. The user input may be provided via any of the mechanisms described herein whether through a GUI, wizard, and/or a command line. The user may also provide an input indicating that no further domains are to be created. If another domain is to be added, method 700 loops back to block 710 where further domain is created and processing continues. If no further domains are to be created, method 700 continues to block 750.

In block 750 the system is capable of generating a platform. The platform may include one or more software artifacts that support the domains created for the SoC. In one or more embodiments, the platform includes a first stage boot loader type of software artifact. The first stage boot loader is a program that may be loaded into the SoC at boot time. For example, the first stage boot loader may be included in a boot image that may be loaded into the SoC. The system is capable of generating the first stage boot loader and include the configuration data generated in block 730 for each of the domains created.

The boot sequence of the SoC is capable of running the first stage boot loader in response loading the first stage boot loader and/or the boot image into the SoC. The first stage boot loader, in response to execution within the SoC, is capable of performing a variety of different functions. In one aspect, the first stage boot loader is capable of initializing the hardware resources and configuration registers within the processor system of the SoC.

In another aspect, the first stage boot loader is capable of configuring the architecture of the SoC. For example, the first stage boot loader is capable of configuring the processor system of the SoC by writing configuration data for the processor system to the appropriate configuration registers of the SoC. The configuration data specifies operational settings for the various hardware resources included in the processor system to implement each of the domains concurrently. Further, the configuration data includes the configuration data for the isolation circuits in the processor system. As such, the first stage boot loader, when loaded into the heterogeneous SoC, implements the domains and isolates the domains that have been defined.

In another aspect, the first stage boot loader is capable of loading a configuration bitstream that may be included in the boot image into configuration memory of the SoC. Loading a configuration bitstream as described implements physical circuitry within the programmable circuitry of the SoC that is defined by the configuration bitstream.

In one or more embodiments, a software artifact generated by the system includes a processor initialization file. In particular embodiments, the processor initialization file may be a "C configuration file." The processor initialization file may include system initialization code for the processor system. The processor initialization file may include register sequences such as, for example, mask_write, mask_poll, and mask_read. The processor initialization file may be generated based upon user input specifying the processor system configuration. The processor initialization file is included in the first stage boot loader application. When a user creates a domain and assigns hardware resources to the domain such as memory, a UART, etc., the isolation circuitry needs to be reconfigured. The configuration register sequence for the isolation circuitry will change. These changes, e.g., the configuration register sequence for the isolation circuitry, may be part of the processor initialization file.

In one or more embodiments, the platform includes one or more operating system type software artifacts. For example, the system is capable of generating one or more operating system artifacts for each of the domains that have been created for the platform. In creating the operating system artifacts, any settings and/or properties specified within block 725, for example, for resources added to the domains are honored.

An example of an operating system artifact that may be generated as part of block 750 is a device tree. The system is capable of generating a device tree for the operating system of each of the domains that have been created and that utilize a device tree. The device tree that is generated honors the settings, address ranges, and/or properties specified in block 725. The device tree for a given domain will only include the hardware resources allocated or assigned to that domain. As such, the operating system will only "see" the devices listed in the device tree, which corresponds to the devices available in the domain.

In one or more embodiments, the platform includes software artifacts such as one or more data structures and/or files that specify information about the configuration of the SoC and the domains included therein. The platform, or particular software artifacts, for example, may be loaded into an application development environment (e.g., an application executing in a computing system). The application development environment may be configured to develop applications and/or programs that are intended to run on the domains of the SoC. In that case, when a software developer uses the application development environment to create a program for a domain, the software artifacts specifying information about the configuration may be imported and used for application development purposes.

An example of a software artifact that may be imported into an application development environment is a linker script. The system is capable of generating a linker script for each of the domains and outputting the linker scripts and software artifacts. In general, each linker script controls operation of the linker for generating executable applications for a particular domain of the SoC. For example, the linker script for a particular domain is capable of mapping input files into an output file and controlling the memory layout of the output file given the established properties of the domain, e.g., addressable memory of the domain and the like. In using the linker scripts, for example, the application being assembled is unable to see any portions of memory that are not available to the domain executing the application being developed. The application is only able to see or access those portions of memory (e.g., RAM) that are assigned to the domain.

For example, when a software developer opens the application development environment and loads the platform, the software developer may specify a particular domain of the platform for which an application is to be developed. The application development environment is capable of making any software artifacts for the specified domain available to the software developer. As an illustrative and nonlimiting example, each different operating system will utilize particular driver calls based upon the operating system of the domain and the devices that are included in the domain. In developing an application for a domain that uses FreeRTOS, for example, the software development environment may translate particular statements (e.g., "print" statements) directed to a particular device into driver calls for that device. If for example an application for a domain attempts to write data via UART0, and UART0 is part of the domain, the application development environment is capable of replacing statements accessing UART0, e.g., "print" statements, with device driver calls for UART0. If the application includes statements that attempt to access a device that is not included in the domain, then a build of the application will fail. For example, if the application includes a print statement directed to a UART0, but UART0 is not included in the domain, a build operation of the application will fail.

In other cases, if a software developer knows the address of a device that is not in the domain for which an application is being developed and writes program code to access that address (e.g., manually specifies such address), when the application is executed in the SoC, the isolation circuit(s) included therein will reject such transactions directed to hardware resources that are not part of the domain of the application.

The inventive arrangements allow a software developer to try different combinations of processors, devices, and/or operating systems without having to utilize hardware development tools to redefine domains for a given heterogeneous SoC. Using tool as described herein, a software developer is capable of defining domains and also redefining domains while using the same hardware description file generated from the hardware design application. The ability to specify domains at the software level rather than at the hardware level (e.g., using a hardware design application) allows the software developer to modify and/or redefine domains in significantly less time than would otherwise be the case. Each time the software developer makes a modification to the domain(s), the domain creation tool is capable of outputting an updated version of the platform.

The application developer, for example, may modify the platform through the GUI and/or via the command line interface. The application developer, for example, may adjust memory partitioning among the domains, change the operating system of a domain, and/or reassign devices among the domains. Upon completing the modifications and/or in response to a command to generate the platform, the domain creation application generates the updated platform implementing the modifications. The updated platform is generated based upon the original hardware description file as opposed to a modified hardware description file regenerated in the hardware design application.

The resulting platform, e.g., the first stage boot loader, may be included within a boot image. The boot image may also include one or more configuration bitstreams and/or other executable program code for execution in the domains. As discussed, the executable program code (e.g., operating systems and/or applications for the domains) may be created using the inventive arrangements described herein and/or using software artifacts generated using the inventive arrangements described herein.

The boot image may be loaded into a target SoC and used to configure the target SoC. In response to loading the boot image, the first stage boot loader may be run as described. Further, the programmable circuitry may be configured by loading a configuration bitstream from the boot image. The executable program code (e.g., operating systems and/or applications) that may be included in the boot image may be loaded into appropriate memory regions or partitions for the respective domains and executed.

Figure 8:
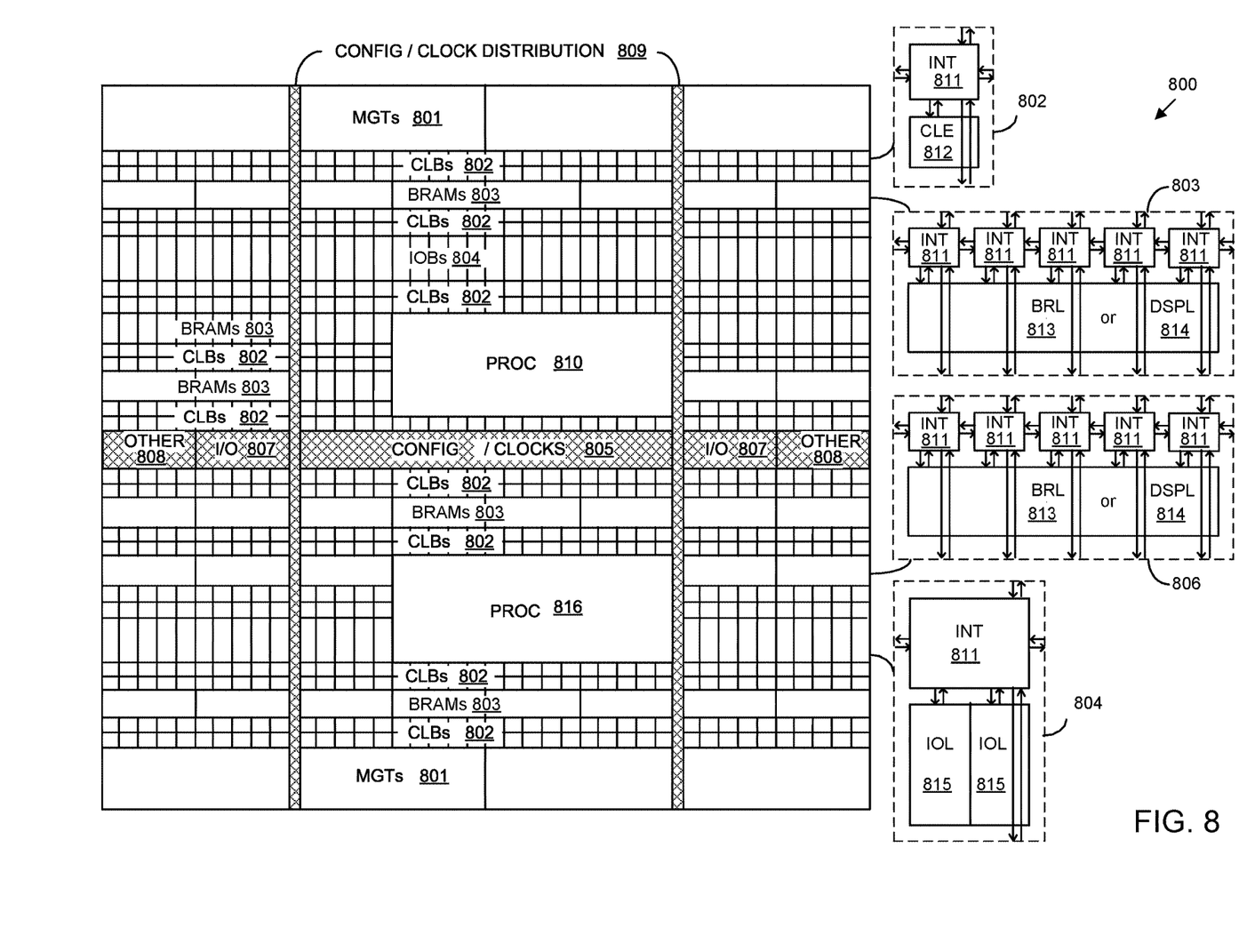
FIG. 8 illustrates an example architecture for an SoC type of IC.

FIG. 8 illustrates an example architecture 800 for an IC. In one aspect, architecture 800 may be implemented within a programmable IC. For example, architecture 800 may be used to implement a field programmable gate array (FPGA). Architecture 800 may also be representative of an SoC type of IC (e.g., a heterogeneous SoC).

As shown, architecture 800 includes several different types of programmable circuit, e.g., logic, blocks. For example, architecture 800 may include a large number of different programmable tiles including multi-gigabit transceivers (MGTs) 801, configurable logic blocks (CLBs) 802, random-access memory blocks (BRAMs) 803, input/output blocks (IOBs) 804, configuration and clocking logic (CONFIG/CLOCKS) 805, digital signal processing blocks (DSPs) 806, specialized I/O blocks 807 (e.g., configuration ports and clock ports), and other programmable logic 808 such as digital clock managers, analog-to-digital converters, system monitoring logic, and so forth.

In some ICs, each programmable tile includes a programmable interconnect element (INT) 811 having standardized connections to and from a corresponding INT 811 in each adjacent tile. Therefore, INTs 811, taken together, implement the programmable interconnect structure for the illustrated IC. Each INT 811 also includes the connections to and from the programmable logic element within the same tile, as shown by the examples included at the top of FIG. 8.

For example, a CLB 802 may include a configurable logic element (CLE) 812 that may be programmed to implement user logic plus a single INT 811. A BRAM 803 may include a BRAM logic element (BRL) 813 in addition to one or more INTs 811. Typically, the number of INTs 811 included in a tile depends on the height of the tile. As pictured, a BRAM tile has the same height as five CLBs, but other numbers (e.g., four) also may be used. A DSP tile 806 may include a DSP logic element (DSPL) 814 in addition to an appropriate number of INTs 811. An IOB 804 may include, for example, two instances of an I/O logic element (IOL) 815 in addition to one instance of an INT 811. The actual I/O pads connected to IOL 815 may not be confined to the area of IOL 815.

In the example pictured in FIG. 8, a columnar area near the center of the die, e.g., formed of regions 805, 807, and 808, may be used for configuration, clock, and other control logic. Horizontal areas 809 extending from this column may be used to distribute the clocks and configuration signals across the breadth of the programmable IC.

Some ICs utilizing the architecture illustrated in FIG. 8 include additional logic blocks that disrupt the regular columnar structure making up a large part of the IC. The additional logic blocks may be programmable blocks and/or dedicated circuitry. For example, two or more processor blocks depicted as PROC 810 and PROC 816 span several columns of CLBs and BRAMs.

In one aspect, PROC 810 and/or PROC 816 may be implemented as dedicated circuitry, e.g., as hardwired processors, that are fabricated as part of the die that implements the programmable circuitry of the IC. PROC 810 and/or PROC 816 may represent any of a variety of different processor types and/or systems ranging in complexity from an individual processor, e.g., a single core capable of executing program code, to an entire processor system having one or more cores, modules, co-processors, interfaces, or the like.

In another aspect, PROC 810 and/or PROC 816 may be omitted from architecture 800 and replaced with one or more of the other varieties of the programmable blocks described. Further, such blocks may be utilized to form "soft processor (s)" in that the various blocks of programmable circuitry may be used to form processors that can execute program code as is the case with PROC 810 and/or PROC 816.

The phrase "programmable circuitry" refers to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, circuit blocks shown in FIG. 8 that are external to PROC 810 such as CLBs 802 and BRAMs 803 are considered programmable circuitry of the IC.

As discussed herein, PROC 810 is capable of executing a first operating system, while PROC 816 is capable of executing a second and different operating system. Further, the devices available to each of PROC 810 and PROC 816 may be different and defined by the domains created by a first stage boot loader executed within architecture 800 at boot time.

In general, the functionality of programmable circuitry is not established until configuration data is loaded into the IC. A set of configuration bits may be used to program programmable circuitry of an IC such as an FPGA. The configuration bit(s) typically are referred to as a "configuration bitstream." In general, programmable circuitry is not operational or functional without first loading a configuration bitstream into the IC. The configuration bitstream effectively implements a particular circuit design within the programmable circuitry. The circuit design specifies, for example, functional aspects of the programmable circuit blocks and physical connectivity among the various programmable circuit blocks.

Circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry is generally considered to have dedicated circuit blocks and interconnects, for example, that are functional without first loading a configuration bitstream into the IC, e.g., PROC 810 and/or PROC 816.

In some instances, hardwired circuitry may have one or more operational modes that can be set or selected according to register settings or values stored in one or more memory elements within the IC. The operational modes may be set, for example, through the loading of a configuration data into the IC. Despite this ability, hardwired circuitry is not considered programmable circuitry as the hardwired circuitry is operable and has a particular function when manufactured as part of the IC.

FIG. 8 is intended to illustrate an example architecture that may be used to implement an IC that includes programmable circuitry, e.g., a programmable fabric. For example, the number of logic blocks in a column, the relative width of the columns, the number and order of columns, the types of logic blocks included in the columns, the relative sizes of the logic blocks, and the interconnect/logic implementations included at the top of FIG. 8 are purely illustrative. In an actual IC, for example, more than one adjacent column of CLBs is typically included wherever the CLBs appear, to facilitate the efficient implementation of a user circuit design. The number of adjacent CLB columns, however, may vary with the overall size of the IC. Further, the size and/or positioning of blocks such as PROC 810 within the IC are for purposes of illustration only and are not intended as limitations.

For purposes of explanation, specific nomenclature is set forth to provide a thorough understanding of the various inventive concepts disclosed herein. The terminology used herein, however, is for the purpose of describing particular aspects of the inventive arrangements only and is not intended to be limiting.

As defined herein, the singular forms "a," "an," and "the" are intended to include the plural forms as well, unless the context clearly indicates otherwise.

As defined herein, the terms "at least one," "one or more," and "and/or," are open-ended expressions that are both conjunctive and disjunctive in operation unless explicitly stated otherwise. For example, each of the expressions "at least one of A, B, and C," "at least one of A, B, or C," "one or more of A, B, and C," "one or more of A, B, or C," and "A, B, and/or C" means A alone, B alone, C alone, A and B together, A and C together, B and C together, or A, B and C together.

As defined herein, the term "automatically" means without user intervention. As defined herein, the term "user" means a human being.

As defined herein, the term "computer readable storage medium" means a storage medium that contains or stores program code for use by or in connection with an instruction execution system, apparatus, or device. As defined herein, a "computer readable storage medium" is not a transitory, propagating signal per se. A computer readable storage medium may be, but is not limited to, an electronic storage device, a magnetic storage device, an optical storage device, an electromagnetic storage device, a semiconductor storage device, or any suitable combination of the foregoing. The various forms of memory, as described herein, are examples of computer readable storage media. A non-exhaustive list of more specific examples of a computer readable storage medium may include: a portable computer diskette, a hard disk, a RAM, a read-only memory (ROM), an erasable programmable read-only memory (EPROM or Flash memory), an electronically erasable programmable read-only memory (EEPROM), a static random-access memory (SRAM), a portable compact disc read-only memory (CD-ROM), a digital versatile disk (DVD), a memory stick, a floppy disk, or the like.

As defined herein, the term "if" means "when" or "upon" or "in response to" or "responsive to," depending upon the context. Thus, the phrase "if it is determined" or "if [a stated condition or event] is detected" may be construed to mean "upon determining" or "in response to determining" or "upon detecting [the stated condition or event]" or "in response to detecting [the stated condition or event]" or "responsive to detecting [the stated condition or event]" depending on the context.

As defined herein, the term "responsive to" and similar language as described above, e.g., "if," "when," or "upon," means responding or reacting readily to an action or event. The response or reaction is performed automatically. Thus, if a second action is performed "responsive to" a first action, there is a causal relationship between an occurrence of the first action and an occurrence of the second action. The term "responsive to" indicates the causal relationship.

As defined herein, the terms "one embodiment," "an embodiment," "one or more embodiments," "particular embodiments," or similar language mean that a particular feature, structure, or characteristic described in connection with the embodiment is included in at least one embodiment described within this disclosure. Thus, appearances of the phrases "in one embodiment," "in an embodiment," "in one or more embodiments," "in particular embodiments," and similar language throughout this disclosure may, but do not necessarily, all refer to the same embodiment. The terms "embodiment" and "arrangement" are used interchangeably within this disclosure.

As defined herein, the term "processor" means at least one hardware circuit. The hardware circuit may be configured to carry out instructions contained in program code. The hardware circuit may be an integrated circuit. Examples of a processor include, but are not limited to, a central processing unit (CPU), an array processor, a vector processor, a digital signal processor (DSP), a programmable logic array (PLA), an ASIC, and a controller.

As defined herein, the term "output" means storing in physical memory elements, e.g., devices, writing to display or other peripheral output device, sending or transmitting to another system, exporting, or the like.

As defined herein, the term "real-time" means a level of processing responsiveness that a user or system senses as sufficiently immediate for a particular process or determination to be made, or that enables the processor to keep up with some external process.

As defined herein, the term "substantially" means that the recited characteristic, parameter, or value need not be achieved exactly, but that deviations or variations, including for example, tolerances, measurement error, measurement accuracy limitations, and other factors known to those of skill in the art, may occur in amounts that do not preclude the effect the characteristic was intended to provide.

The terms first, second, etc. may be used herein to describe various elements. These elements should not be limited by these terms, as these terms are only used to distinguish one element from another unless stated otherwise or the context clearly indicates otherwise.

A computer program product may include a computer readable storage medium (or media) having computer readable program instructions thereon for causing a processor to carry out aspects of the inventive arrangements described herein. Within this disclosure, the term "program code" is used interchangeably with the term "computer readable program instructions." Computer readable program instructions described herein may be downloaded to respective computing/processing devices from a computer readable storage medium or to an external computer or external storage device via a network, for example, the Internet, a LAN, a WAN and/or a wireless network. The network may include copper transmission cables, optical transmission fibers, wireless transmission, routers, firewalls, switches, gateway computers and/or edge devices including edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations for the inventive arrangements described herein may be assembler instructions, instruction-set-architecture (ISA) instructions, machine instructions, machine dependent instructions, microcode, firmware instructions, or either source code or object code written in any combination of one or more programming languages, including an object-oriented programming language and/or procedural programming languages. Computer readable program instructions may include state-setting data. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a LAN or a WAN, or the connection may be made to an external computer (for example, through the Internet using an Internet Service Provider). In some cases, electronic circuitry including, for example, programmable logic circuitry, an FPGA, or a PLA may execute the computer readable program instructions by utilizing state information of the computer readable program instructions to personalize the electronic circuitry, in order to perform aspects of the inventive arrangements described herein.

Certain aspects of the inventive arrangements are described herein with reference to flowchart illustrations and/or block diagrams of methods, apparatus (systems), and computer program products. It will be understood that each block of the flowchart illustrations and/or block diagrams, and combinations of blocks in the flowchart illustrations and/or block diagrams, may be implemented by computer readable program instructions, e.g., program code.

These computer readable program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the operations specified in the flowchart and/or block diagram block or blocks.

The computer readable program instructions may also be loaded onto a computer, other programmable data processing apparatus, or other device to cause a series of operations to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various aspects of the inventive arrangements. In this regard, each block in the flowchart or block diagrams may represent a module, segment, or portion of instructions, which comprises one or more executable instructions for implementing the specified operations.

In some alternative implementations, the operations noted in the blocks may occur out of the order noted in the figures. For example, two blocks shown in succession may be executed substantially concurrently, or the blocks may sometimes be executed in the reverse order, depending upon the functionality involved. In other examples, blocks may be performed generally in increasing numeric order while in still other examples, one or more blocks may be performed in varying order with the results being stored and utilized in subsequent or other blocks that do not immediately follow. It will also be noted that each block of the block diagrams and/or flowchart illustration, and combinations of blocks in the block diagrams and/or flowchart illustration, may be implemented by special purpose hardware-based systems that perform the specified functions or acts or carry out combinations of special purpose hardware and computer instructions.

The corresponding structures, materials, acts, and equivalents of all means or step plus function elements that may be found in the claims below are intended to include any structure, material, or act for performing the function in combination with other claimed elements as specifically claimed.

In one or more embodiments, a method may include receiving a hardware description file specifying a plurality of processors and a plurality of hardware resources available within a heterogeneous SoC and creating, using computer hardware, a plurality of domains for the heterogeneous SoC, wherein each domain includes a processor selected from the plurality of processors and a hardware resource selected from the plurality of hardware resources. The method may include assigning, using the computer hardware, an operating system to each domain and generating, using the computer hardware, a platform that is configured to implement the plurality of domains within the heterogeneous SoC.

In an aspect, the platform includes configuration data for configuring isolation circuits of the heterogeneous SoC.

In another aspect, the platform includes a first stage boot loader configured to initialize a processor system of the heterogeneous SoC.

In another aspect, the platform includes, for a selected domain of the plurality of domains, a device tree for the operating system assigned to the selected domain, wherein the device tree is generated based upon the hardware resource selected from the plurality of hardware resources.

In another aspect, each domain is logically enforced within the heterogeneous SoC.

In another aspect, the method may include modifying at least one domain of the plurality of domains for the heterogeneous SoC using the hardware description file.

In another aspect, the platform includes a plurality of artifacts for the plurality of domains for use by a software development environment. Accordingly, the method may include generating executable program code for a selected domain of the plurality of domains using an artifact selected from the plurality of artifacts that corresponds to the selected domain.

In another aspect, each domain is assigned a portion of available random-access memory.

In one or more embodiments, a system includes a memory configured to store program code and a processor coupled to the memory. The processor, in response to executing the program code, is configured to initiate operations. The executable operations may include receiving a hardware description file specifying a plurality of processors and a plurality of hardware resources available within a heterogeneous SoC and creating a plurality of domains for the heterogeneous SoC, wherein each domain includes a processor selected from the plurality of processors and a hardware resource selected from the plurality of hardware resources. The operations may include assigning an operating system to each domain and generating a platform that is configured to implement the plurality of domains within the heterogeneous SoC.

In an aspect, the platform includes configuration data for configuring isolation circuits of the heterogeneous SoC.

In another aspect, the platform includes a first stage boot loader configured to initialize a processor system of the heterogeneous SoC.

In another aspect, the platform includes, for a selected domain of the plurality of domains, a device tree for the operating system assigned to the selected domain, wherein the device tree is generated based upon the hardware resource selected from the plurality of hardware resources.

In another aspect, each domain is logically enforced within the heterogeneous SoC.

In another aspect, the processor is configured to initiate executable operations that may include modifying at least one domain of the plurality of domains for the heterogeneous SoC using the hardware description file.

In another aspect, the platform includes a plurality of artifacts for the plurality of domains for use by a software development environment. Accordingly, the processor is configured to initiate executable operations that may include generating executable program code for a selected domain of the plurality of domains using an artifact selected from the plurality of artifacts that corresponds to the selected domain.

In another aspect, each domain is assigned a portion of available random-access memory.

In one or more embodiments, a computer program product includes a computer readable storage medium having program code stored thereon. The program code is executable by computer hardware to initiate operations. The operations may include receiving a hardware description file specifying a plurality of processors and a plurality of hardware resources available within a heterogeneous SoC and creating a plurality of domains for the heterogeneous SoC, wherein each domain includes a processor selected from the plurality of processors and a hardware resource selected from the plurality of hardware resources. The operations may include assigning an operating system to each domain and generating a platform that is configured to implement the plurality of domains within the heterogeneous SoC.

In an aspect, the platform includes configuration data for configuring isolation circuits of the heterogeneous SoC.

In another aspect, the platform includes a first stage boot loader configured to initialize a processor system of the heterogeneous SoC.

In another aspect, the platform includes, for a selected domain of the plurality of domains, a device tree for the operating system assigned to the selected domain, wherein the device tree is generated based upon the hardware resource selected from the plurality of hardware resources.

In another aspect, each domain is logically enforced within the heterogeneous SoC.

In another aspect, the program code is executable by the computer hardware to initiate operations that may include modifying at least one domain of the plurality of domains for the heterogeneous SoC using the hardware description file.

In another aspect, the platform includes a plurality of artifacts for the plurality of domains for use by a software development environment. Accordingly, the program code is executable by the computer hardware to initiate operations that may include generating executable program code for a selected domain of the plurality of domains using an artifact selected from the plurality of artifacts that corresponds to the selected domain.

In another aspect, each domain is assigned a portion of available random-access memory.

The description of the inventive arrangements provided herein is for purposes of illustration and is not intended to be exhaustive or limited to the form and examples disclosed. The terminology used herein was chosen to explain the principles of the inventive arrangements, the practical application or technical improvement over technologies found in the marketplace, and/or to enable others of ordinary skill in the art to understand the inventive arrangements disclosed herein. Modifications and variations may be apparent to those of ordinary skill in the art without departing from the scope and spirit of the described inventive arrangements. Accordingly, reference should be made to the following claims, rather than to the foregoing disclosure, as indicating the scope of such features and implementations.

What is claimed is:

1. A method, comprising:
receiving a hardware description file specifying a plurality of processors and a plurality of hardware resources of a heterogeneous System-on-Chip (SoC), wherein the plurality of processors are configured to execute program code and are available for use by a design for the SoC, and wherein the plurality of hardware resources are available for use by embedded applications;
based on the hardware description file and received user input, determining, using computer hardware, a plurality of domains for the heterogeneous SoC, wherein each domain includes a processor selected from the plurality of processors and a hardware resource selected from the plurality of hardware resources;
for each of the plurality of domains, assigning, using the computer hardware, an operating system to the domain or designating the domain for execution of a standalone application; and
generating, using the computer hardware, a platform configured to implement the plurality of domains within the heterogeneous SoC and isolate the plurality of domains from one another, wherein the platform is used to build the embedded applications that execute on the processors assigned to the respective domains.

2. The method of claim 1, wherein the platform includes configuration data for configuring isolation circuits of the heterogeneous SoC, and wherein the isolation circuits regulate access to the hardware resources included in the respective domains.

3. The method of claim 1, wherein the platform includes a first stage boot loader configured to initialize a processor system of the heterogeneous SoC.

4. The method of claim 1, wherein the platform includes, for a selected domain of the plurality of domains, a device tree for the operating system assigned to the selected domain, wherein the device tree is generated based upon the hardware resource selected from the plurality of hardware resources.

5. The method of claim 1, wherein the platform includes drivers for the hardware resources included in the respective domains, wherein the drivers correspond to the operating system or the standalone application of the respective domain.

6. The method of claim 1, further comprising:
modifying at least one domain of the plurality of domains for the heterogeneous SoC using the hardware description file.

7. The method of claim 1, wherein the platform includes a plurality of artifacts for the plurality of domains for use by a software development environment, the method further comprising:
generating executable program code for a selected domain of the plurality of domains using an artifact selected from the plurality of artifacts that corresponds to the selected domain.

8. The method of claim 1, wherein the platform includes a linker script corresponding to each respective domain.

9. A system, comprising:
a memory configured to store program code; and
a processor coupled to the memory, wherein the processor, in response to executing the program code, is configured to initiate operations including:
receiving a hardware description file specifying a plurality of processors and a plurality of hardware resources of a heterogeneous System-on-Chip (SoC), wherein the plurality of processors are configured to execute program code and are available for use by a design for the SoC, and wherein the plurality of hardware resources are available for use by embedded applications;
based on the hardware description file and received user input, determining a plurality of domains for the heterogeneous SoC, wherein each domain includes a processor selected from the plurality of processors and a hardware resource selected from the plurality of hardware resources;
for each of the plurality of domains, assigning an operating system to the domain or designating the domain for execution of a standalone application; and
generating a platform configured to implement the plurality of domains within the heterogeneous SoC and isolate the plurality of domains from one another, wherein the platform is used to build the embedded applications that execute on the processors assigned to the respective domains.

10. The system of claim 9, wherein the platform includes configuration data for configuring isolation circuits of the heterogeneous SoC, and wherein the isolation circuits regulate access to the hardware resources included in the respective domains.

11. The system of claim 9, wherein the platform includes a first stage boot loader configured to initialize a processor system of the heterogeneous SoC.

12. The system of claim 9, wherein the platform includes, for a selected domain of the plurality of domains, a device tree for the operating system assigned to the selected domain, wherein the device tree is generated based upon the hardware resource selected from the plurality of hardware resources.

13. The system of claim 9, wherein the platform includes drivers for the hardware resources included in the respective domains, wherein the drivers correspond to the operating system or the standalone application of the respective domain.

14. The system of claim 9, wherein the processor is configured to initiate operations further comprising:
modifying at least one domain of the plurality of domains for the heterogeneous SoC using the hardware description file.

15. The system of claim 9, wherein the platform includes a plurality of artifacts for the plurality of domains for use by a software development environment, wherein the processor is configured to initiate operations further comprising:
generating executable program code for a selected domain of the plurality of domains using an artifact selected from the plurality of artifacts that corresponds to the selected domain.

16. The system of claim 9, wherein the platform includes a linker script corresponding to each respective domain.

17. A computer program product, comprising:
a computer readable storage medium having program code stored thereon, the program code executable by computer hardware to initiate operations including:
receiving a hardware description file specifying a plurality of processors and a plurality of hardware resources of a heterogeneous System-on-Chip (SoC), wherein the plurality of processors are configured to execute program code and are available for use by a design for the SoC, and wherein the plurality of hardware resources are available for use by embedded applications;
based on the hardware description file and received user input, determining a plurality of domains for the heterogeneous SoC, wherein each domain includes a processor selected from the plurality of processors and a hardware resource selected from the plurality of hardware resources;
for each of the plurality of domains, assigning an operating system to the domain or designating the domain for execution of a standalone application; and
generating a platform configured to implement the plurality of domains within the heterogeneous SoC and isolate the plurality of domains from one another, wherein the platform is used to build the embedded applications that execute on the processors assigned to the respective domains.

18. The computer program product of claim 17, wherein the platform includes configuration data for configuring isolation circuits of the heterogeneous SoC, and wherein the isolation circuits regulate access to the hardware resources included in the respective domains.

19. The computer program product of claim 17, wherein the platform includes a first stage boot loader configured to initialize a processor system of the heterogeneous SoC.

20. The computer program product of claim 17, wherein the platform includes, for a selected domain of the plurality of domains, a device tree for the operating system assigned to the selected domain, wherein the device tree is generated based upon the hardware resource selected from the plurality of hardware resources.

\* \* \* \* \*